United States Patent [19]
Kyi

[11] Patent Number: 5,717,646
[45] Date of Patent: Feb. 10, 1998

[54] RANDOM ACCESS MULTIPORT MEMORY CAPABLE OF SIMULTANEOUSLY ACCESSING MEMORY CELLS FROM A PLURALITY OF INTERFACE PORTS

[76] Inventor: Ben-I Kyi, 3409 Royal Meadow La., San Jose, Calif. 95135

[21] Appl. No.: 761,008

[22] Filed: Dec. 5, 1996

[51] Int. Cl.[6] ............................................. G11C 8/00
[52] U.S. Cl. ........................ 365/230.05; 365/230.06; 365/189.04
[58] Field of Search ............... 365/230.05, 230.06, 365/189.04

[56] References Cited

U.S. PATENT DOCUMENTS

| | | | |
|---|---|---|---|
| 4,740,894 | 4/1988 | Lyon | 395/476 |
| 4,930,066 | 5/1990 | Yokota | 395/476 |
| 5,201,037 | 4/1993 | Kohiyama et al. | 395/518 |
| 5,247,637 | 9/1993 | Leedom et al. | 395/476 |
| 5,530,836 | 6/1996 | Busch et al. | 395/477 |
| 5,542,067 | 7/1996 | Chappell et al. | 395/494 |

Primary Examiner—David C. Nelms
Assistant Examiner—Andrew Q. Tran

[57] ABSTRACT

A random access multiport memory includes a plurality of interface ports, a read/write control logic and a random access memory. Each interface port consists of an address bus, a data input/output bus, a read input signal and a write input signal. The read/write control logic consists of a plurality of address decoders, an input control logic and an output control logic. This random access multiport memory provides the capability that each addressable memory location can be directly, independently and randomly read or write by the plurality of ports.

1 Claim, 5 Drawing Sheets

RANDOM ACCESS MULTIPORT MEMORY CAPABLE OF SIMULTANEOUSLY ACCESSING MEMORY CELLS FROM A PLURALITY OF INTERFACE PORTS

FIELD OF INVENTION

This invention relates to multiport memory where the individual data can be independently, randomly and simultaneously accessed by each interface port.

BACKGROUND OF THE INVENTION

Conventional multiport memory systems use serial bit, an arbiter, time sharing, sequential access data, memory bank or switching network methods to share a single port or multiple single port memory. All of these methods require extra steps or waiting time in order to access data. For instance, the conventional multiport memory systems in conjunction with the memory bank only allow one interface port to access a memory bank at a time. If there were several interface ports required to access the same memory bank, only one interface port can access the particular memory bank, the other interface ports must queuing for their request and wait until its turn. This defeats the purpose of multiport memory design—data sharing and access time reduction.

To solve these problems, the present invention allows data to be accessed by each port directly and concurrently without waiting. Today the IC packet pin count is high, cell density is huge and the price is low. So it is perfect time to design high pin count, high speed and high density true random access multiport memory like the present invention.

SUMMARY OF THE INVENTION

Therefore the objective of the present invention is to design a simple and high speed random access multiport memory to solve the conventional multiport memory problems.

The above object is obtained by providing a random access multiport memory includes a plurality of interface ports, a read/write control logic and a random access memory. Each interface port consists of an address bus, a data input/output bus, a read input signal and a write input signal. The read/write control logic consists of a plurality of address decoders, an input control logic and an output control logic.

The address decoder is used to decode the address bus and generate an enable signal for the specific memory location. When the write strobe is active, the data in the data bus will be write to the memory where the address enable signal is active. When the read signal is active, the data in the specific memory location selected by address enable signal will be transferred to the data bus. Since the memory is not divided to memory bank, the data in the entire memory is accessible by each port randomly and simultaneously.

BRIEF DESCRIPTION OF THE DRAWINGS

FIG. 3 depicts detail of the random access multiport memory for plurality port of data bit 1.

DETAIL DESCRIPTION OF THE INVENTION

Figure 1:
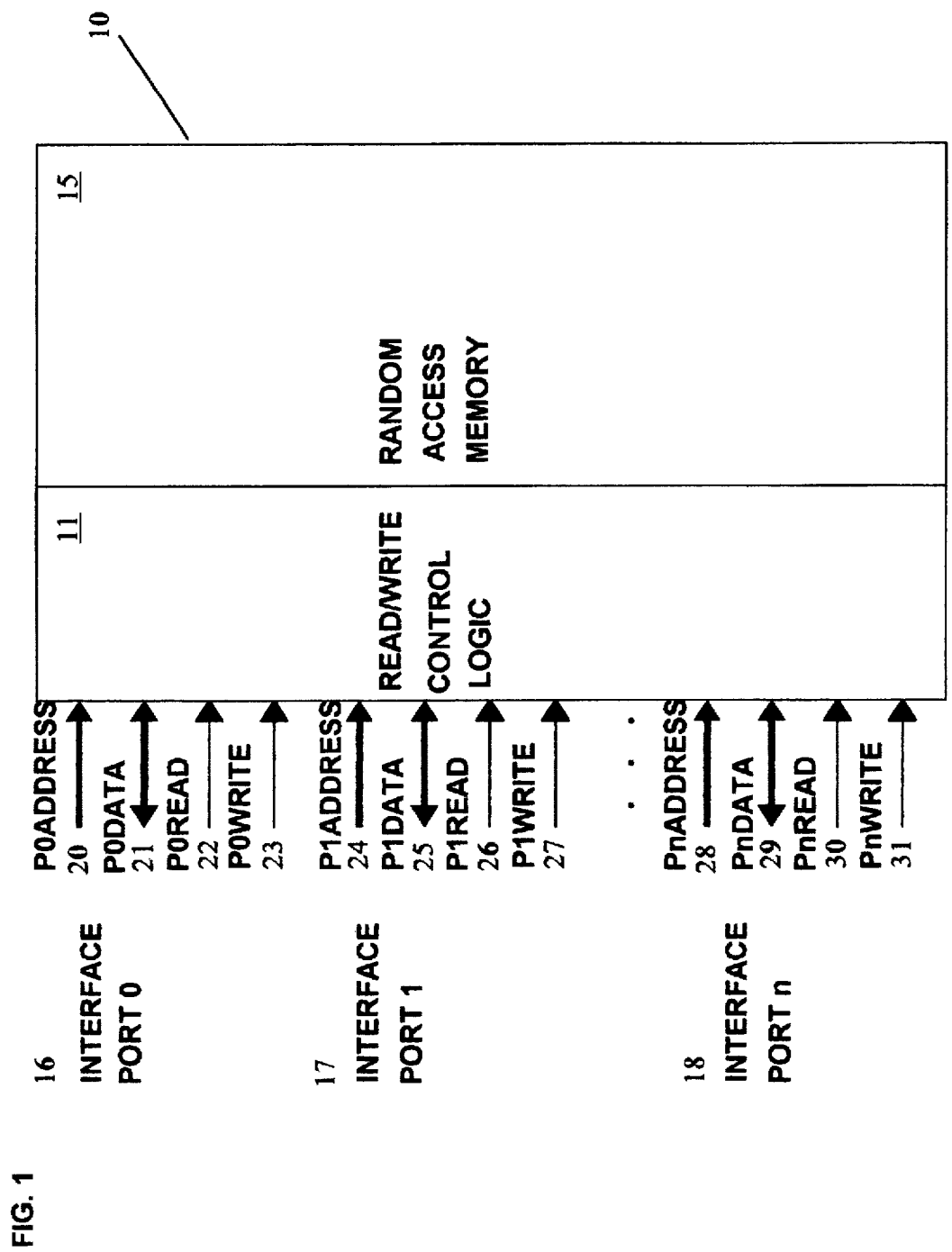
FIG. 1 is a block diagram of the random access multiport memory of the present invention.

As shown in FIG. 1, the random access multiport memory 10 has multiple interface ports from port 0 16 to port n 18, a read/write control logic 11 and a random access memory 15. Each interface port (e.g., 16, 17 or 18) consists an address bus input (e.g., 20, 24 or 28) range from address bit 0 to address bit j, an input/output data bus (e.g., 21, 25 or 29) range from data bit 0 to data bit k, a read enable input signal (e.g., 22, 26 or 30) and a write enable input signal (e.g., 23, 27 or 31). The addressable memory location is from address 0 to address m. All interface ports associates with a read/write control logic 11. The read/write control logic 11 decodes the address and then generates the address enable signal. It 11 also generates the write strobe if the write input signal is active. The write strobe and read input signal control the read or write action for each memory cell where the address specified by the address enable signal. The random access memory 15 can be directly, independently and randomly accessed by the plurality of interface ports (e.g., 16, 17 or 18).

Figure 2:
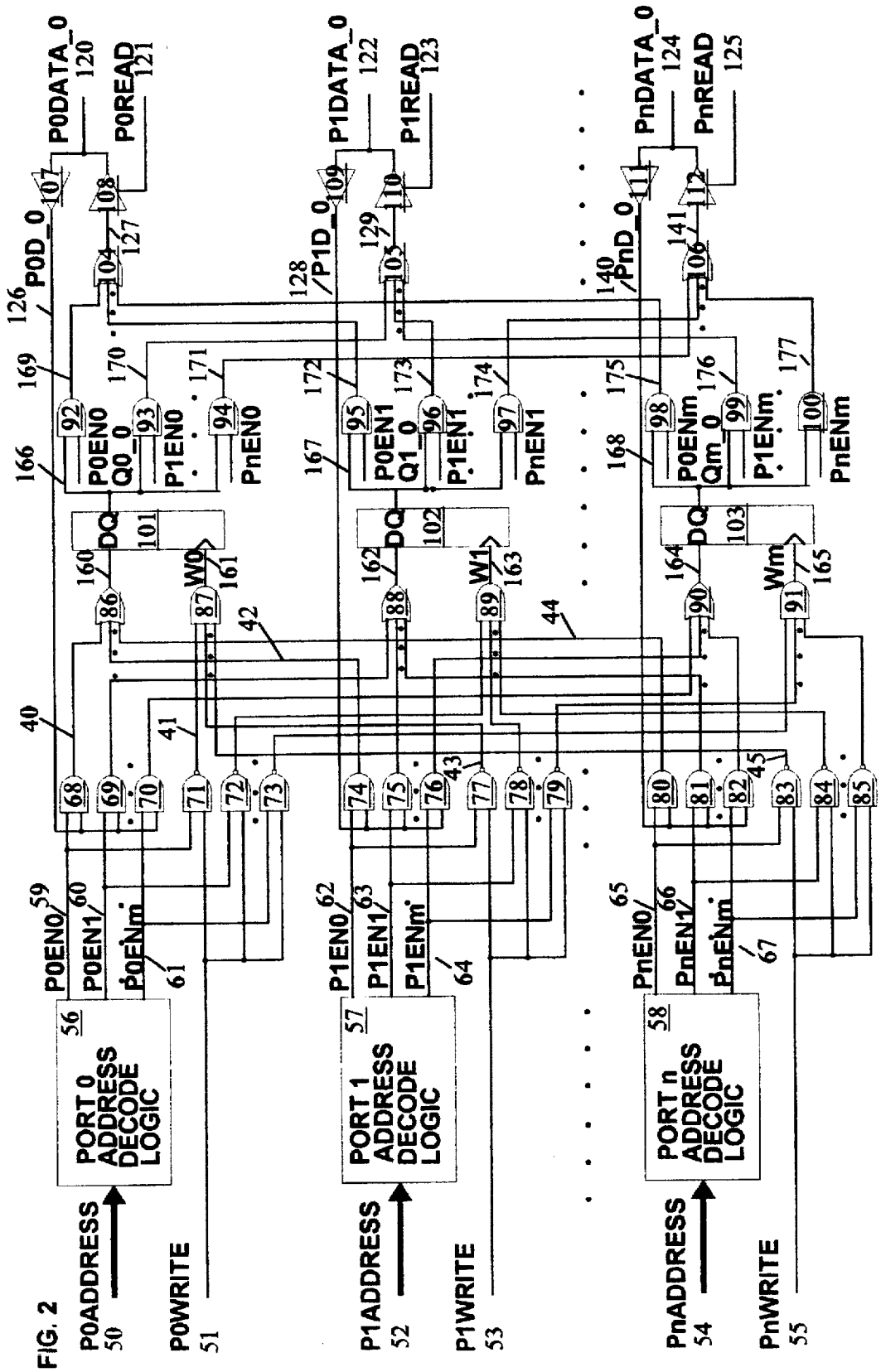
FIG. 2 depicts detail of the random access multiport memory for plurality port of data bit 0.

FIG. 2 depicts detail of random access multiport memory 10 for plurality port of data bit 0. An example of read and write operations for data bit 0 is described as following:

The port 0 address decoder 56 decodes the address input 50 then generates address enable signals P0EN0 59 for address 0, P0EN1 60 for address 1 and P0ENm 61 for address m. Similarly signals P1EN0 62, P1EN1 63 and P1ENm 64 are generated by port 1 address decoder 57 and signals PnEN0 65, PnEN1 66 and PnENm 67 are generated by port n address decoder 58.

In write mode, the control flow for address 0 data bit 0 as following: The port 0 data bit 0 PODATA__0 120 goes through a data buffer 107 and then generates the data signal POD__0 126. The AND gate 68 takes the input signals POEN0 59 and port 0 data bit 0 data input signal POD__0 126 and then emits the output signal 40. Similarly AND gate 74 emits signal 42 and AND gate 80 emits signal 44. Signals 40, 42 and 44 are inputs to the OR gate 86 and the output of this OR gate 86 is the data signal 160 for address 0 bit 0 memory cell 101. The NAND gate 71 takes the input signals 59 and port 0 write input signal POWRITE 51 and then emits the write enable signal 41. Similarly NAND gate 77 emits write enable signal 43 and NAND gate 83 emits write enable signal 45. Signals 41, 43 and 45 are inputs to the AND gate 87 and the output of this AND gate 87 is the write strobe W0 161 for address 0. The rising edges of write strobe W0 161 will let data 160, which presents at memory cell 101 D input, to be stored in the memory cell 101. This data will be presented at the Q output Q0__0 166 of memory cell 101.

In read mode, the control flow for data bit 0 of port 0 as following: The AND gate 92 takes the input signals POEN0 59 and the Q output Q0__0 166 of memory cell 101 and then emits the output signal 169. Similarly AND gate 95 emits signal 172 and AND gate 98 emits signal 175. Signals 169, 172 and 175 are inputs to the OR gate 104 and the output of this OR gate 104 is the data output signal 127 for port 0 data bit 0. The port 0 read input signal POREAD 121 enables the data transmission from signal 127 to port 0 data bit 0 PODATA__0 120 by the tristate buffer 108.

Figure 3:
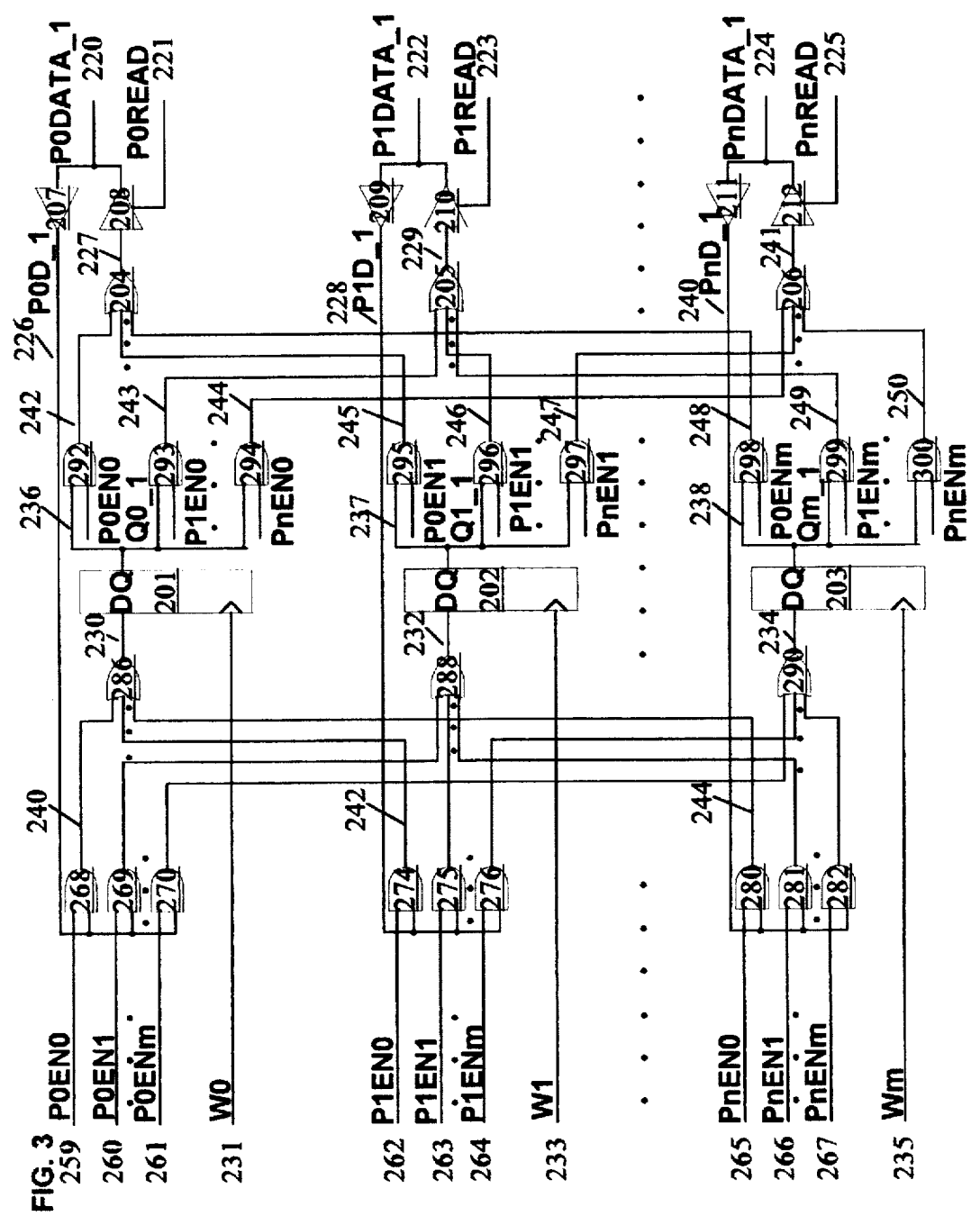

FIG. 3 depicts detail of random access multiport memory 10 for plurality port of data bit 1. An example of read and write operations for data bit 1 is described as following:

In write mode, the control flow for address 0 data bit 1 as following: The port 0 data bit 1PODATA__1 220 goes through a data buffer 207 and then generates the data signal POD__1 226. The AND gate 268 takes the input signals POEN0 259 and port 0 data bit 1 data input signal POD__1 226 and then emits the output signal 240. Similarly AND gate 274 emits signal 242 and AND gate 280 emits signal 244. Signals 240, 242 and 244 are inputs to the OR gate 286 and the output of this OR gate 286 is the data signal 230 for address 0 bit 1 memory cell 201. The rising edges of write strobe W0 231 will let data 230, which presents at memory cell 201 D input, to be stored in the memory cell 201. This data will be presented at the Q output Q0_1 236 of memory cell 201.

In read mode, the control flow for data bit 1 of port 0 as following: The AND gate 292 takes the input signals POEN0 259 and the Q output Q0_1 236 of memory cell 201 and then emits the output signal 242. Similarly AND gate 295 emits signal 245 and AND gate 298 emits signal 248. Signals 242, 245 and 248 are inputs to the OR gate 204 and the output of this OR gate 204 is the data output signal 227 for port 0 data bit 1. The port 0 read input signal POREAD 221 enables the data transmission from signal 227 to port 0 data bit 1 PODATA_1 220 by the tristate buffer 208.

Figure 4:
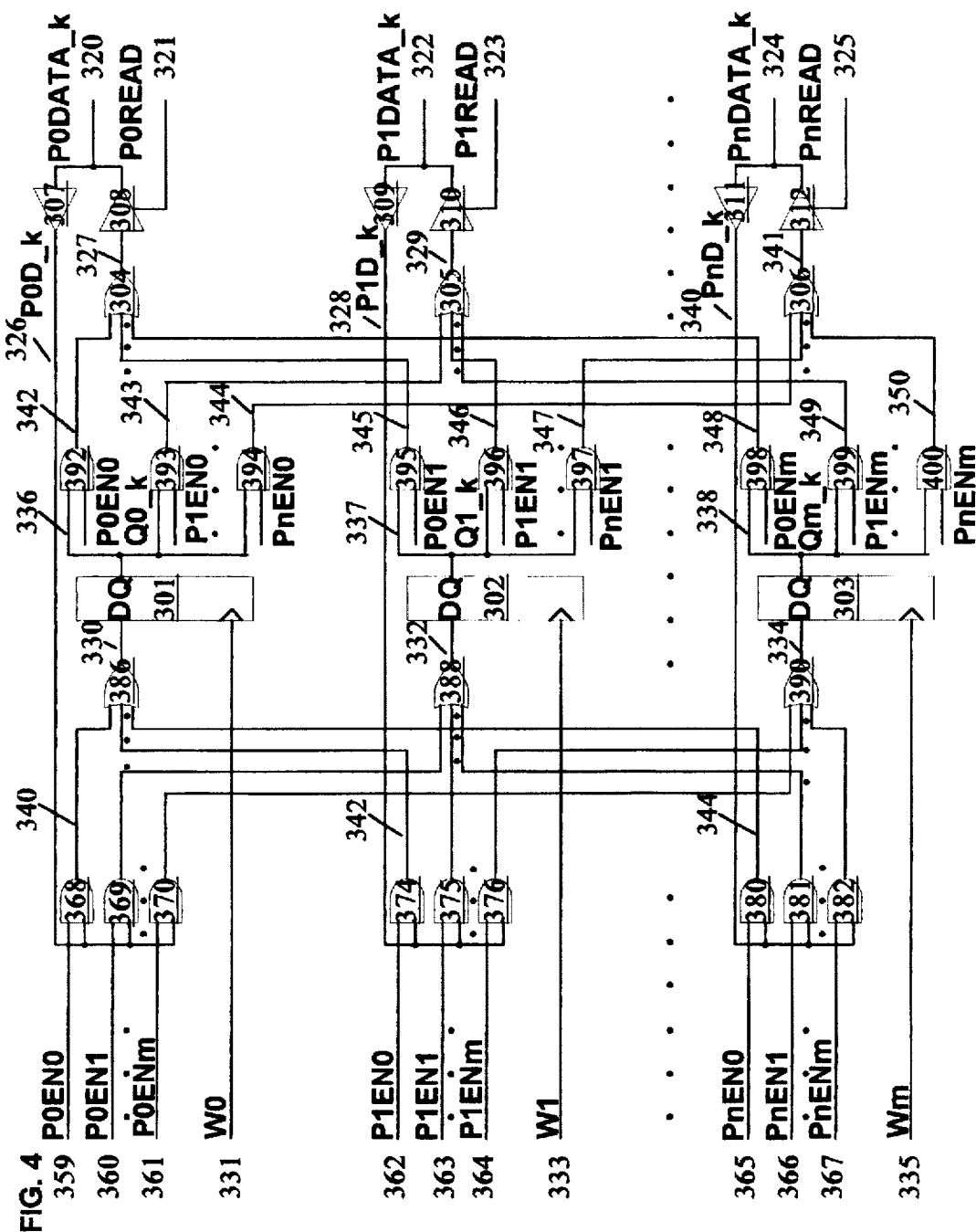
FIG. 4 depicts detail of the random access multiport memory for plurality port of data bit k.

FIG. 4 depicts detail of random access multiport memory 10 for plurality port of data bit k. An example of read and write operations for data bit k is described as following:

In write mode, the control flow for address 0 data bit k as following: The port 0 data bit k PODATA_k 320 goes through a data buffer 307 and then generates the data signal POD_k 326. The AND gate 368 takes the input signals POEN0 359 and port 0 data bit k data input signal POD_k 326 and then emits the output signal 340. Similarly AND gate 374 emits signal 342 and AND gate 380 emits signal 344. Signals 340, 342 and 344 are inputs to the OR gate 386 and the output of this OR gate 386 is the data signal 330 for address 0 bit k memory cell 301. The rising edges of write strobe W0 331 will let data 330, which presents at memory cell 301 D input, to be stored in the memory cell 301. This data will be presented at the Q output Q0_k 336 of memory cell 301.

In read mode, the control flow for data bit k of port 0 as following: The AND gate 392 takes the input signals POEN0 359 and the Q output Q0_k 336 of memory cell 301 and then emits the output signal 342. Similarly AND gate 395 emits signal 245 and AND gate 398 emits signal 348. Signals 342, 345 and 348 are inputs to the OR gate 304 and the output of this OR gate 304 is the data output signal 327 for port 0 data bit k. The port 0 read input signal POREAD 321 enables the data transmission from signal 327 to port 0 data bit k PODATA_k 320 by the tristate buffer 308.

Figure 5:
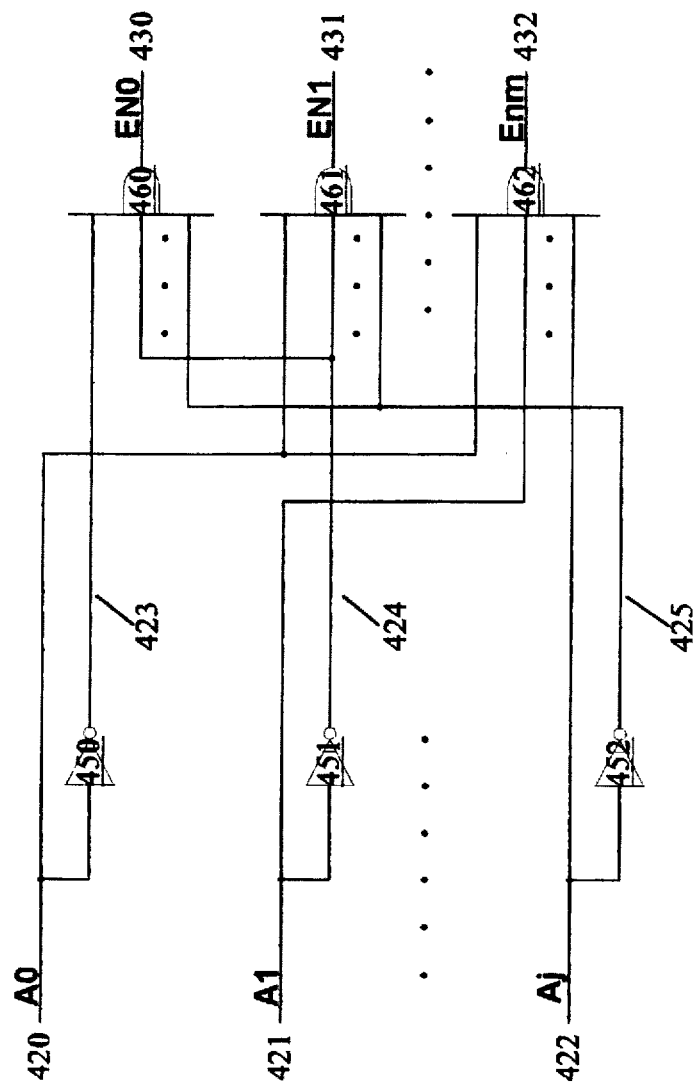
FIG. 5 depicts detail of one address decoder.

FIG. 5 depicts detail of one address decoder. There is one address decoder per interface port. For j+1 bit address bus, there are j+1 inverters for this decoder. The inverter 450 inverts the address bit 0 A0 420 and emits signal 423. Similarly inverter 451 emits signal 424 and inverter 452 emits signal 425. There are 2**(j+1) or m+1 AND gates for each address decoder. These address bus signals and the output signals from all the inverters provide the inputs to the AND gates, therefore generate the address enable signal for the specific memory location.

I claim:

1. A random access multiport memory comprising a plurality of interface ports means, a read/write control logic means and a random access memory means;

said a plurality of interface ports means comprising multiple interface ports where each said interface port consists of an address bus, a data bus, a write input signal and a read input signal;

said a random access memory means comprising memory cells where the data resides, the said data in each addressable memory location can be randomly and simultaneously accessed by each port, said a read/write control logic means comprising a plurality of address decoders, input control logic and output control logic;

for each said interface port, the said address decoder decodes the said address bus and generates address enable signal for the specific said memory cells, the said output control logic transmits data from the said memory cells, which selected by the said address enable signal, to the said data bus if the said read input signal is active; the said input control logic generates write strobe if the said write input signal is active, then the data in the said data bus will be stored into the said memory cells, which selected by the said address enable signal.

* * * * *